United States Patent
Gieskes

(10) Patent No.: US 11,358,247 B2
(45) Date of Patent: Jun. 14, 2022

(54) NOZZLE CHANGER, SYSTEM, AND RELATED METHOD

(71) Applicant: UNIVERSAL INSTRUMENTS CORPORATION, Conklin, NY (US)

(72) Inventor: Koenraad Alexander Gieskes, Deposit, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 201 days.

(21) Appl. No.: 16/341,755

(22) PCT Filed: Dec. 27, 2016

(86) PCT No.: PCT/US2016/068636
§ 371 (c)(1),
(2) Date: Apr. 12, 2019

(87) PCT Pub. No.: WO2018/125028
PCT Pub. Date: Jul. 5, 2018

(65) Prior Publication Data
US 2020/0047298 A1 Feb. 13, 2020

(51) Int. Cl.
*B23Q 3/15* (2006.01)
*B23Q 3/157* (2006.01)
(Continued)

(52) U.S. Cl.
CPC ...... *B23Q 3/15722* (2016.11); *B23Q 3/15506* (2013.01); *B23Q 3/15534* (2016.11); *B23Q 3/15706* (2013.01); *H05K 13/0409* (2018.08)

(58) Field of Classification Search
CPC ............ B23Q 3/15722; B23Q 3/15534; B23Q 3/15506; B23Q 3/15706; H05K 13/0409;
(Continued)

(56) References Cited

U.S. PATENT DOCUMENTS 3,263,300 A 8/1966 Schatzman et al.
3,526,033 A 9/1970 Saunders
(Continued)

FOREIGN PATENT DOCUMENTS

CN 103416117 A 11/2013
JP S6451245 A 2/1989
(Continued)

OTHER PUBLICATIONS

Application No. PCT/US2016/068636, International Search Report and the Written Opinion of the International Searching Authority, or the Declaration dated Mar. 23, 2017. 31 pages.
(Continued)

*Primary Examiner* — Peter Dungba Vo
*Assistant Examiner* — Azm A Parvez
(74) *Attorney, Agent, or Firm* — Schmeiser, Olsen & Watts, LLP

(57) ABSTRACT

Disclosed herein is a system that includes a placement head, the placement head including a spindle assembly, the spindle assembly including a spindle capable of receiving one of a plurality of nozzles for attachment. The system includes a nozzle changer, the nozzle changer including a revolver capable of holding a plurality of nozzles. A position of the nozzle changer is changeable in response to movement of the spindle assembly. Further disclosed is a method of receiving and attaching nozzles with a nozzle changer.

18 Claims, 17 Drawing Sheets

(51) Int. Cl.
*B23Q 3/155* (2006.01)
*H05K 13/04* (2006.01)

(58) Field of Classification Search
CPC ......... Y10T 29/53174; Y10T 29/53178; Y10T 29/53191; Y10T 29/5313
USPC ........................... 29/739, 740, 729, 743, 700
See application file for complete search history.

(56) References Cited

U.S. PATENT DOCUMENTS

| | | | |
|---|---|---|---|
| 3,662,442 A | | 5/1972 | Noa |
| 3,760,490 A | | 9/1973 | Burg |
| 4,053,968 A | | 10/1977 | Johnson et al. |
| 4,563,800 A | | 1/1986 | Bonga |
| 4,614,137 A | | 9/1986 | Jones |
| 4,843,711 A | | 7/1989 | Rager |
| 4,870,744 A | | 10/1989 | Araki et al. |
| 4,951,388 A | | 8/1990 | Eguchi et al. |
| 5,105,528 A | * | 4/1992 | Soth ........................ B23P 19/00 901/41 |
| 5,300,006 A | | 4/1994 | Tanaka et al. |
| 5,410,801 A | | 5/1995 | Shiloh et al. |
| RE35,027 E | | 8/1995 | Ragard |
| 5,741,114 A | | 4/1998 | Onodera |
| 5,807,221 A | | 9/1998 | Yi |
| 6,101,707 A | | 8/2000 | Kano et al. |
| 6,678,944 B1 | | 1/2004 | Kawada |
| 7,032,303 B2 | | 4/2006 | Kawada |
| 2013/0029817 A1 | * | 1/2013 | Yellin ................ B23Q 3/15706 483/59 |
| 2013/0331244 A1 | | 12/2013 | Onsrud et al. |

FOREIGN PATENT DOCUMENTS

| | | | |
|---|---|---|---|
| JP | H1168391 A | | 3/1999 |
| JP | 2000036696 A | | 2/2000 |
| JP | 2004158658 A | | 6/2004 |
| JP | 2008277453 A | | 11/2008 |
| JP | 2010042458 A | | 2/2010 |
| KR | 20100101429 A | * | 9/2010 |
| KR | 20100101429 A | | 9/2010 |

OTHER PUBLICATIONS

Office Action in corresponding Swedish Patent Application No. 1950605-4 dated Jun. 22, 2021. 4 pages.
Office Action in corresponding Chinese Patent Application No. 20680091573.7 dated Jan. 4, 2021. 10 pages.
Office Action in corresponding Japanese Patent Application No. 2019-530695 dated May 7, 2021. 6 pages.
Search Report in related Swedish Patent Application No. 1950605-4, dated Apr. 1, 2020. 10 pages.
Office Action in corresponding Japanese Patent Application No. 2019-530695 dated Nov. 25, 2020. 6 pages.
Written Opinion in corresponding Singaporean Patent Application No. 11201904391T dated Jul. 29, 2020. 6 pages.

* cited by examiner

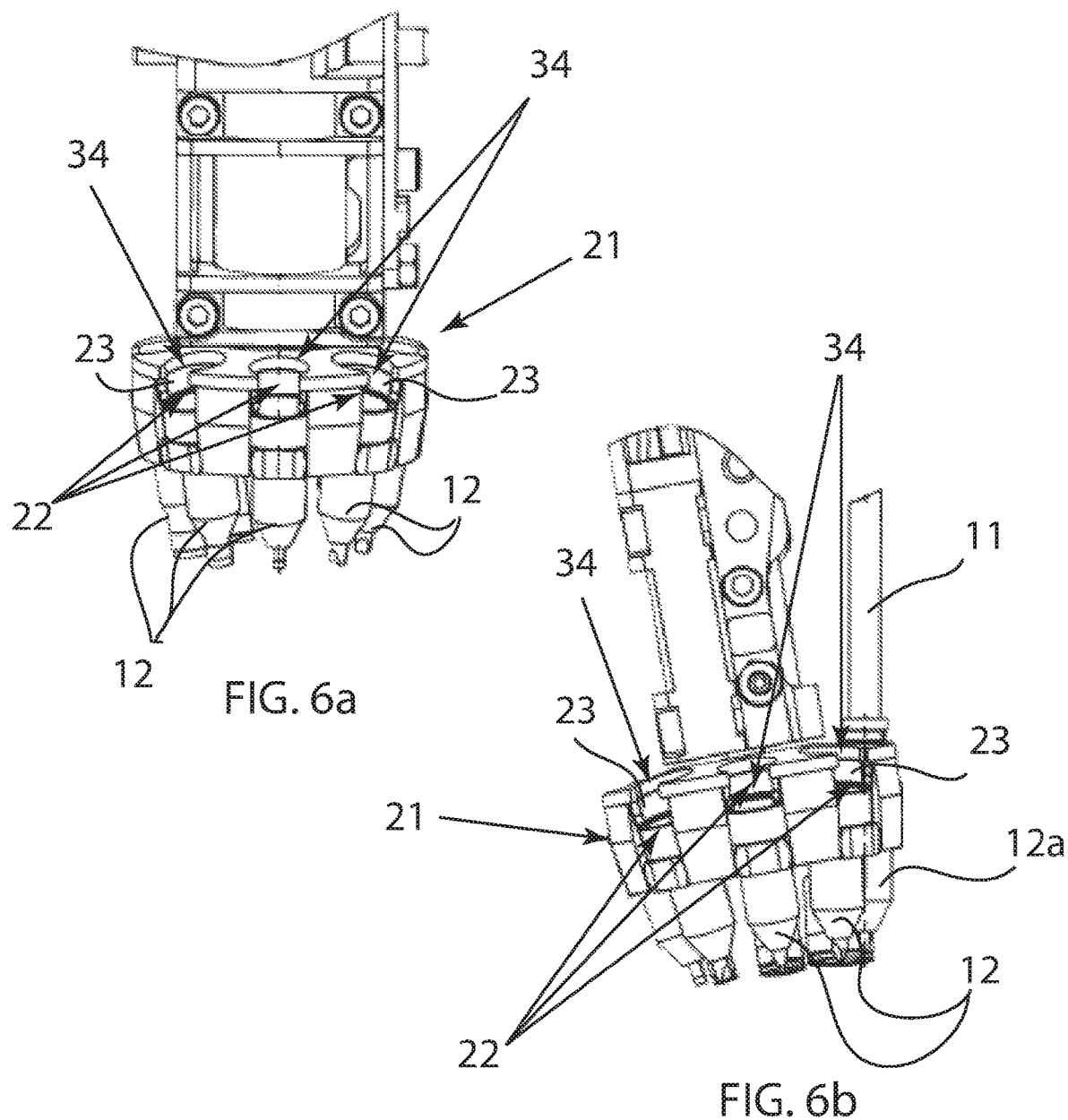

NOZZLE CHANGER, SYSTEM, AND RELATED METHOD

CROSS REFERENCE TO RELATED APPLICATIONS

This application is a National Stage entry of PCT Patent Application No. PCT/US2016/08636, filed Dec. 27, 2016, entitled "NOZZLE CHANGER, SYSTEM, AND RELATED METHOD," the entire contents of which are hereby incorporated by reference.

TECHNICAL FIELD

The subject matter disclosed herein relates generally to nozzles used to pick and place components in electronics assembly machines. More particularly, the subject matter relates to the changing of nozzles in a placement head of a pick and place electronics assembly system.

BACKGROUND

Placement heads are used in electronics assembly machines to pick and place various components onto printed circuit boards. Placement heads typically include a spindle assembly, to which one or more nozzles may be attached to interact with electronic components. Often different nozzles are required in order to pick and place different size or shape electronic components. While methods of changing nozzles are known, they have several disadvantages. For example, requiring movement to a nozzle exchange device, removal of the nozzle, and attachment of a new nozzle may require significant time thus decreasing efficiency. Using multiple nozzles on a spindle assembly unduly increases the mass and weight of the spindle assembly and impacts accuracy of placement. Further, spacing concerns limit the number of alternative nozzles available.

Thus, a replaceable nozzle placement head configured to enable changing of nozzles would be well received in the art.

BRIEF DESCRIPTION

According to a first embodiment, a system comprises: a placement head, the placement head including a spindle assembly, the spindle assembly including a spindle capable of receiving one of a plurality of nozzles for attachment; and a nozzle changer, the nozzle changer including a revolver capable of holding a plurality of nozzles; wherein a position of the nozzle changer is changeable in response to movement of the spindle assembly.

According to a second embodiment, a method comprises: providing a placement head, the placement head including a spindle assembly, the spindle assembly including a spindle; receiving, by the spindle, a first nozzle; attaching, by the spindle, the first nozzle; providing a nozzle changer, the nozzle changer including a revolver; holding, by the revolver, a plurality of nozzles; moving, by the spindle assembly; and changing the position of the nozzle changer in response to movement of the spindle assembly.

According to a third embodiment, a system comprises: a placement head, the placement head including a spindle assembly and a nozzle changer; wherein the spindle assembly includes a spindle capable of receiving one of a plurality of nozzles for attachment; wherein the nozzle changer includes a revolver capable of holding a plurality of nozzles; wherein the spindle assembly and nozzle changer move with the placement head; and wherein the nozzle changer and the spindle assembly are separably movable on the placement head.

BRIEF DESCRIPTION OF THE DRAWINGS

Some embodiments of this invention will be described in detail, with reference to the following figures, in which like designations denote like members, wherein:

FIG. 6a depicts a perspective view of a portion of a nozzle changer of system 100, in accordance with another embodiment;

FIG. 6b depicts a perspective view of a portion of the nozzle changer of FIG. 6a, in accordance with one embodiment;

DETAILED DESCRIPTION

A detailed description of the hereinafter described embodiments of the disclosed system and method are presented herein by way of exemplification and not limitation with reference to the Figures.

Figure 1:
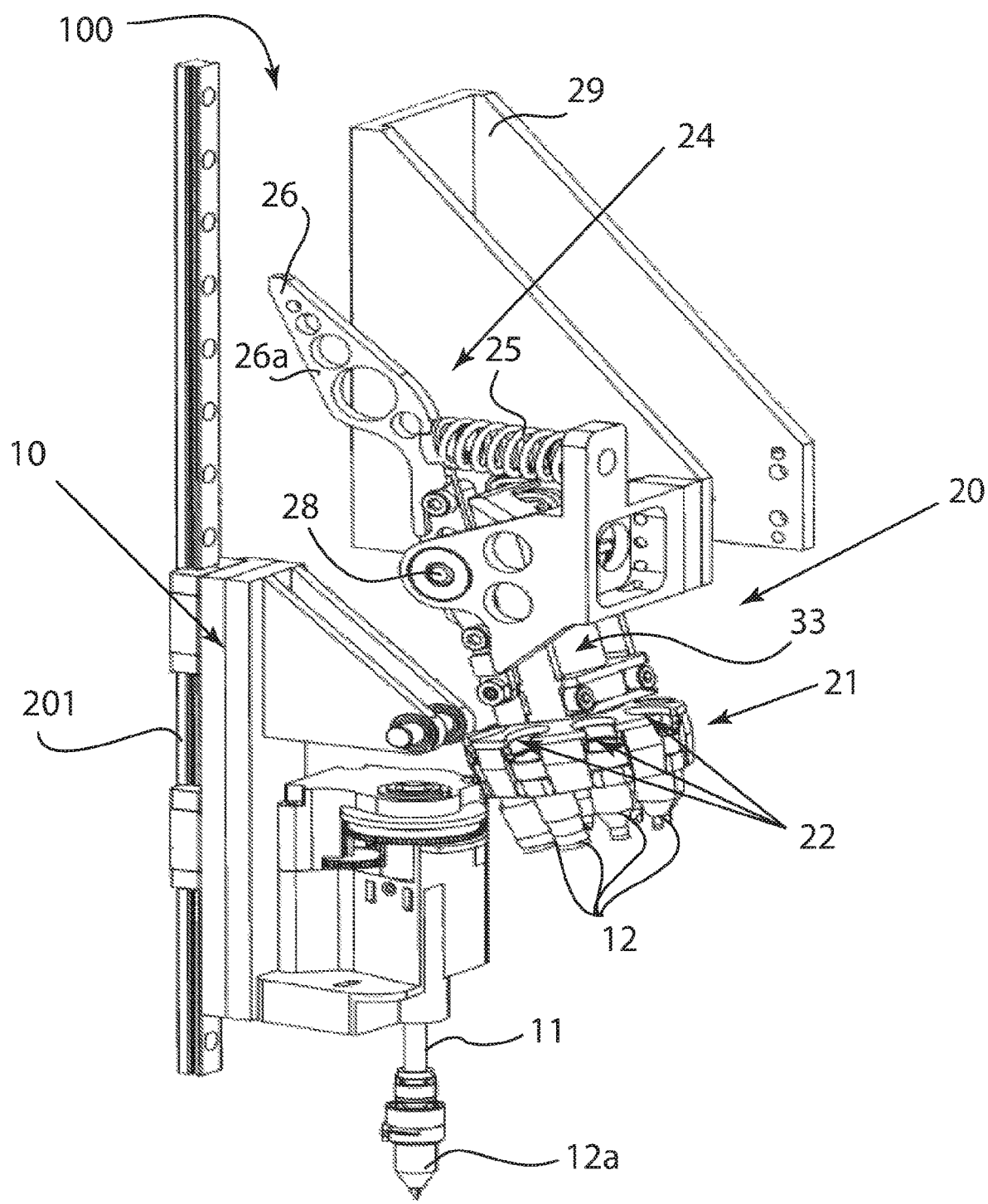
FIG. 1 depicts a perspective view of a system, in which a spindle assembly and a spindle are in a non-retracted position with a first nozzle attached to the spindle, in accordance with one embodiment.

Referring first to FIG. 1, system 100 is shown. The system 100 may comprise a spindle assembly 10 and a nozzle changer 20. The spindle assembly 10 may be capable of movement in a vertical axis (Z) and about a vertical rotational axis (θ).

Figure 2:
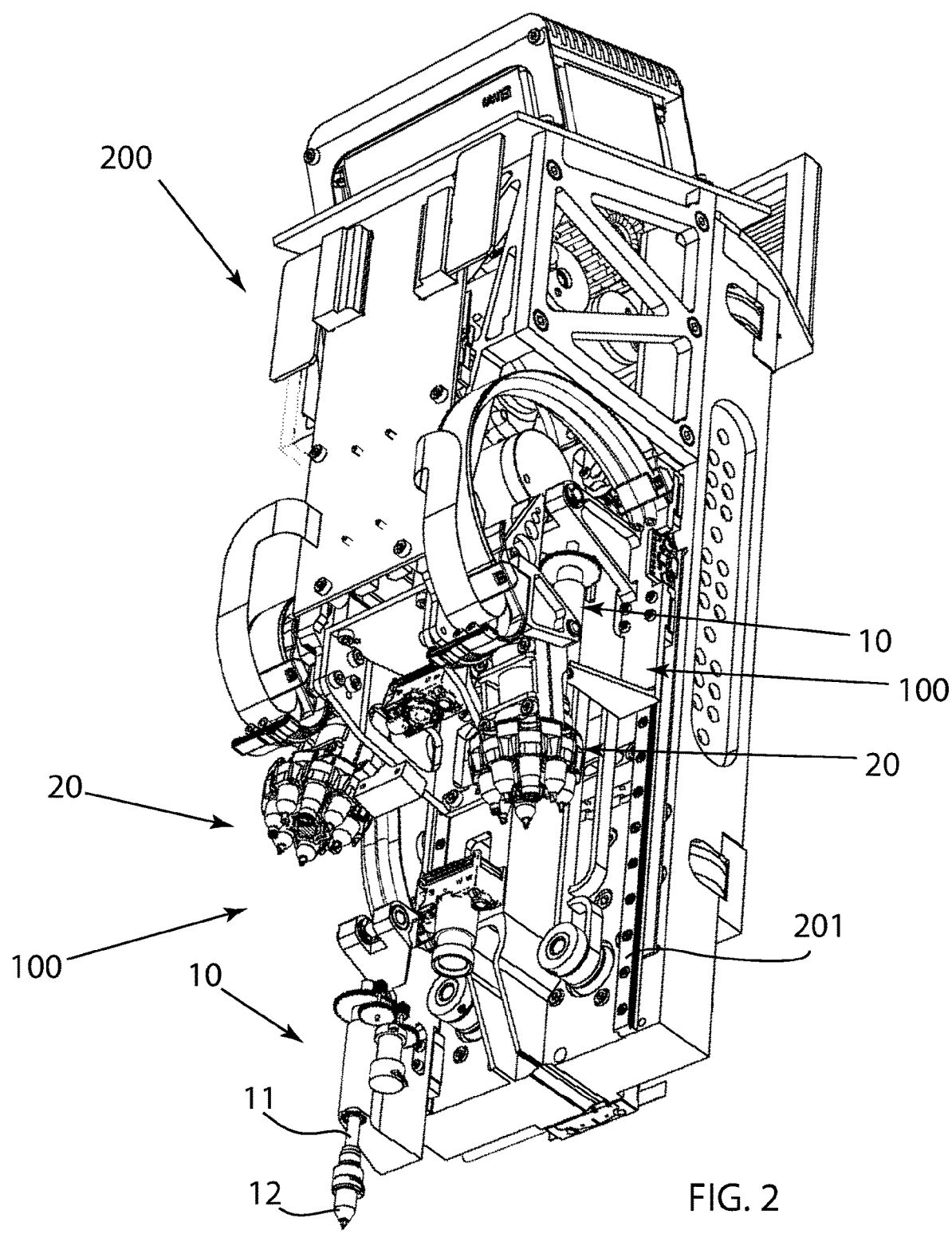
FIG. 2 depicts a side perspective view of a placement head, including the system of FIG. 1, in accordance with one embodiment.

Referring now to FIG. 2, in one embodiment, the system 100 may be attached to a placement head 200 capable of movement in a horizontal plane (X, Y), including a continuous circuitous track. As shown, the placement head 200 may include multiple systems 100 in one embodiment.

Referring again to FIG. 1, in one embodiment the spindle assembly 10 may comprise a spindle 11. One of a plurality of nozzles 12 may be removeably attached to the spindle 11. A first nozzle 12a is shown attached to the spindle 11 in FIGS. 1 and 7-13. In further embodiments, the spindle assembly 10 may also comprise a motor system (not shown) and a placement head support linear bearing 201.

The nozzle changer 20 may comprise a revolver 21 with a plurality of nozzle holders 22, a servo motor 33 capable of rotating the revolver 21, and a cam mechanism 24. In one embodiment, the revolver 21 may be located at an opposite end of the nozzle changer 20 from the cam mechanism 24. The nozzle changer 20 may attach to a nozzle changer support 29, in one embodiment. In a further embodiment, the nozzle changer 20 may be able to pivot or rotate around a central axis 28. The central axis 28 may be a point at which the nozzle changer 20 attaches to the nozzle changer support 29. The nozzle changer 20 may be designed to interact with the spindle assembly 10. In one embodiment, the nozzle changer 20 and cam mechanism 24 may be mounted or otherwise attached to the spindle assembly 10 or the placement head 200. In a further embodiment, the nozzle changer 20 and cam mechanism 24 may be mounted substantially above the spindle assembly 10, as is shown in the Figures, particularly FIG. 10.

Referring still to FIG. 1, in one embodiment, the plurality of nozzle holders 22 may be configured to retain one or more of the plurality of nozzles 12. The plurality of nozzle holders 22 may retain the plurality of nozzles 12 by a variety of means, such as magnetic attraction, a snap detent mechanism, or other means.

In the embodiment pictured in FIG. 1, the spindle assembly 10 is depicted in a non-retracted position. In one embodiment, the non-retracted position may be a position in which the spindle assembly 10, the spindle 11, and one of a plurality of nozzles 12 are being used to pick and place electronic components.

Figure 3A:
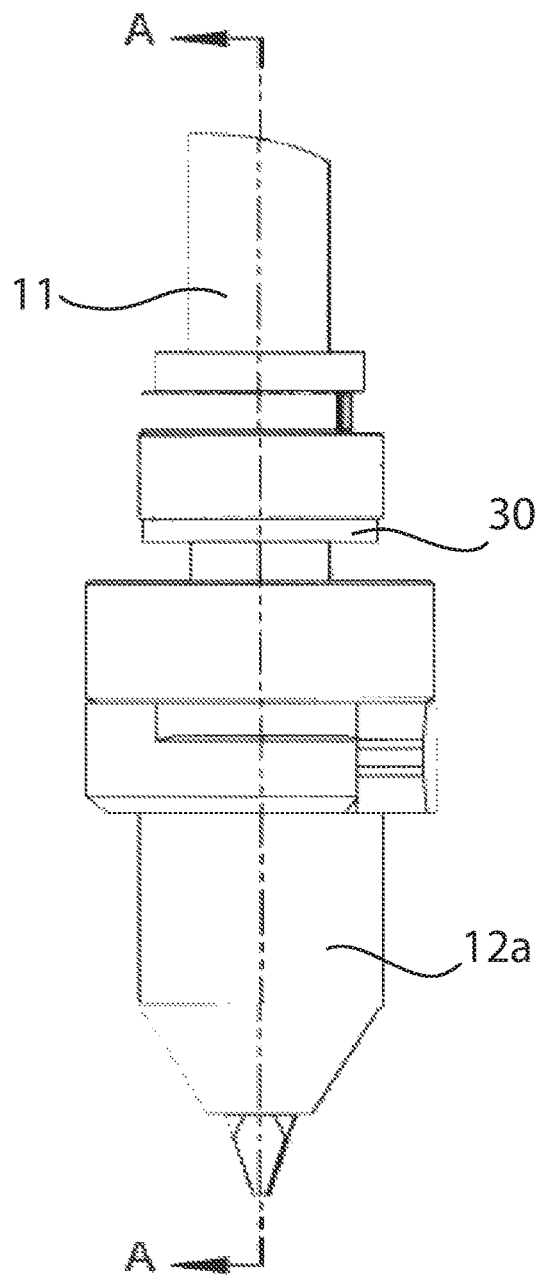
FIG. 3a depicts a side view of a spindle with an attached nozzle in accordance with one embodiment.

Referring now to FIG. 3a, a portion of spindle assembly 10 including the spindle 11 and the first nozzle 12a of the plurality of nozzles 12 is shown. As shown, the first nozzle 12a may be attached to the spindle 11. The first nozzle 12a may be designed to be able to pick and place electronic components using vacuum, grippers, or other attachment means. In one embodiment, each of the plurality of nozzles 12 may be capable of being attached to the spindle 11, thereby allowing the spindle assembly 10 to be capable of picking and placing a variety of electronic components of varying sizes and shapes.

Figure 3B:
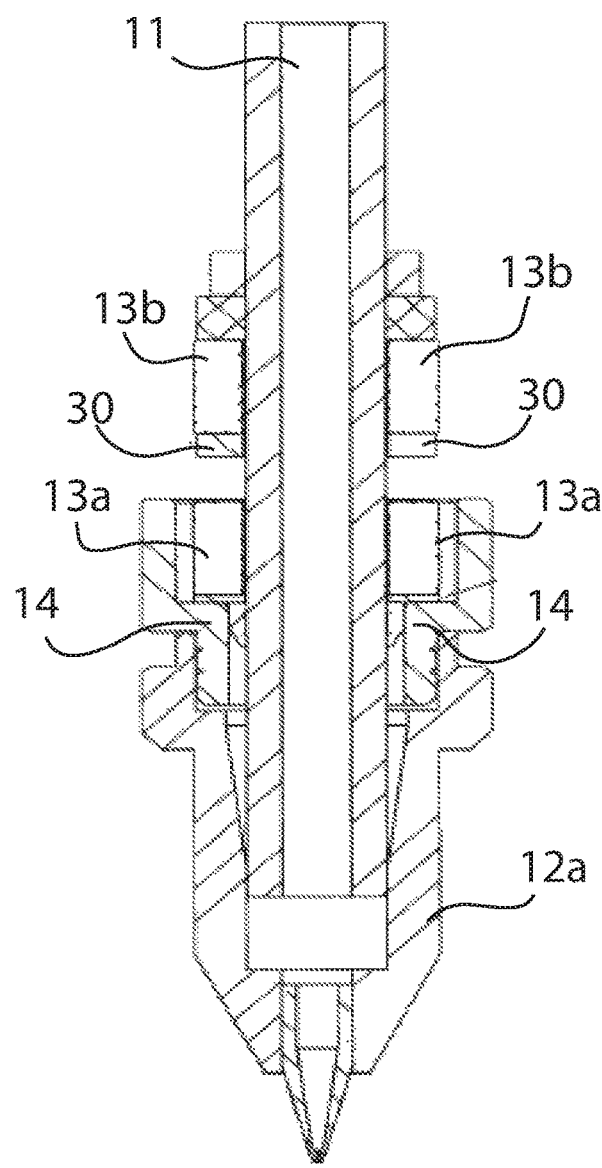
FIG. 3b depicts a side cross-section view of the spindle with attached nozzle of FIG. 3a, in accordance with one embodiment.

Referring now to FIG. 3b, a cross-section of the portion of spindle assembly 10 of FIG. 3a is shown. The cross-section depicts a cut-away according to the axis A-A shown in FIG. 3a. As shown, in one embodiment, the spindle assembly 10 may comprise a spindle magnet 13a which may be used to attach the first nozzle 12a to the spindle 11. As shown, the spindle magnet 13a may be disposed in an annular fashion about the entirety of the circumference of the spindle 11.

Figure 4:
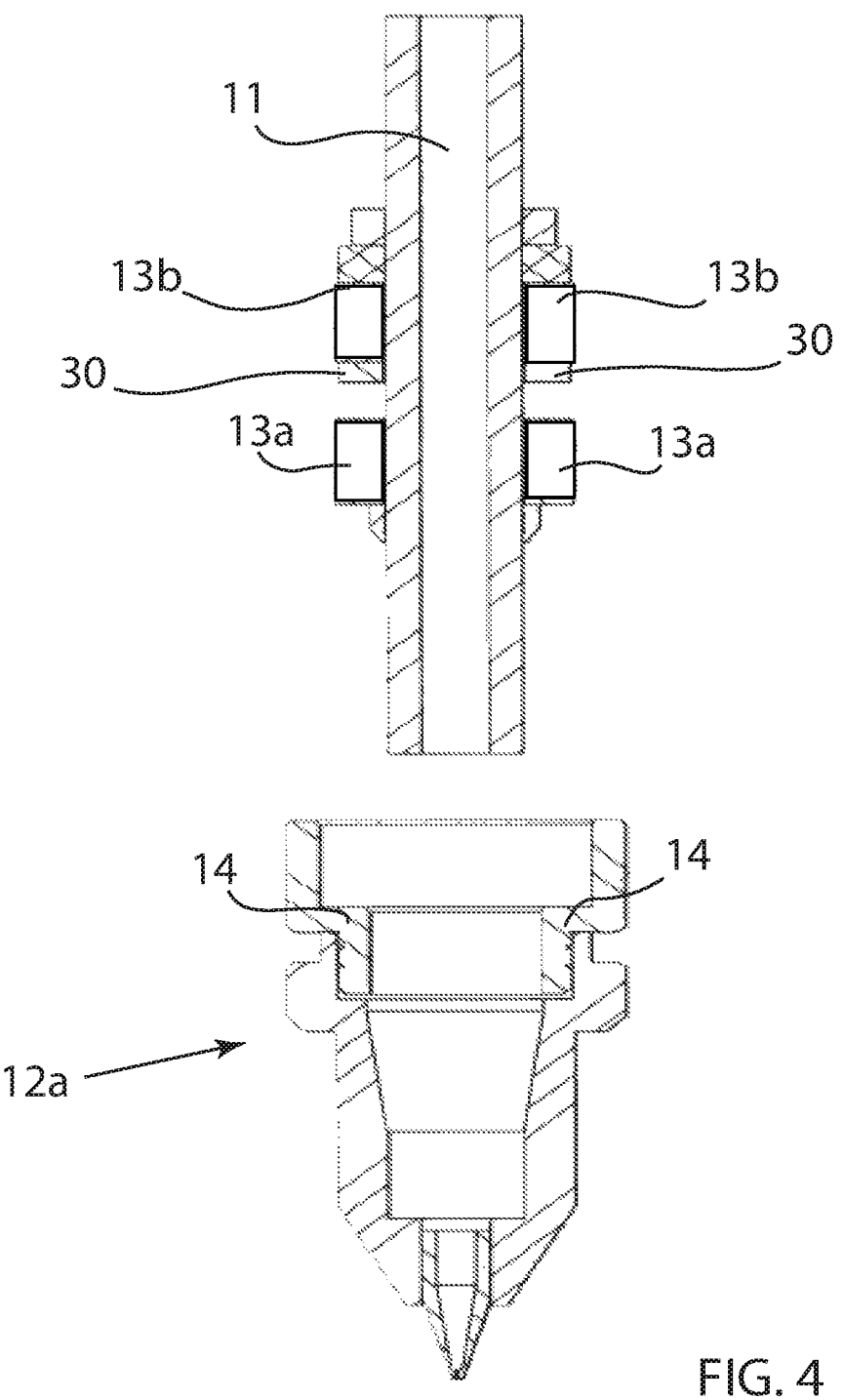
FIG. 4 depicts a side cross-section view of the spindle and nozzle of FIGS. 3a and 3b, where the nozzle is no longer attached to the spindle, in accordance with one embodiment.

In one embodiment, the first nozzle 12a may have a corresponding magnet to provide an attachment force. In another embodiment, the first nozzle 12a may include magnetic components in its structure that will be attracted to the spindle magnets 13a in order to attach the first nozzle 12a to the spindle 11. For example, in one embodiment, the first nozzle 12a may include a nozzle attachment component 14. The nozzle attachment component 14 may be a magnet, or may instead be a magnetic or magnetizable material such as iron or other ferrous material. The nozzle attachment component 14 may be in the form of an iron or steel washer or ring in one embodiment. In a further embodiment, other attachment means may be used, such as attachment by vacuum, grippers, a retaining detent mechanism, or other means known in the art. With reference now to FIG. 4, a cross-section of the spindle 11 and first nozzle 12a are shown, with the first nozzle 12a no longer attached to the spindle 11. It will be understood that the description above referring specifically to the first nozzle 12a may also apply to any of the plurality of nozzles 12.

In one embodiment, the spindle 11 may include a cushioning magnet 13b, as shown in FIGS. 3a, 3b, and 4. The cushioning magnet 13b may be used in conjunction with the spindle magnet 13a to provide for compliance in nozzle 12a when it is attached to the spindle 11. In one embodiment, the cushioning magnet 13b may be mounted in reverse polarity to the spindle magnet 13a, as shown in FIGS. 3b and 4, i.e., the magnets may be mounted so that their south (S) poles are closest to each other, or so that their north (N) poles are closest to each other. The spindle magnet 13a may be moveable axially along the spindle 11 while the cushioning component 13b may be stationary and attached to the spindle 11 in a fixed manner. The reverse polarity between the cushioning magnet 13b and the spindle magnet 13a may be configured to repel the spindle magnet 13a as the spindle magnet 13a moves closer to the cushioning magnet 13b. Further, the cushioning magnet 13b may include a bumper 30 to soften any impact from the spindle magnet 13a contacting the cushioning magnet 13b when the nozzle 12a moves along the spindle 11 during operation.

Figure 5:
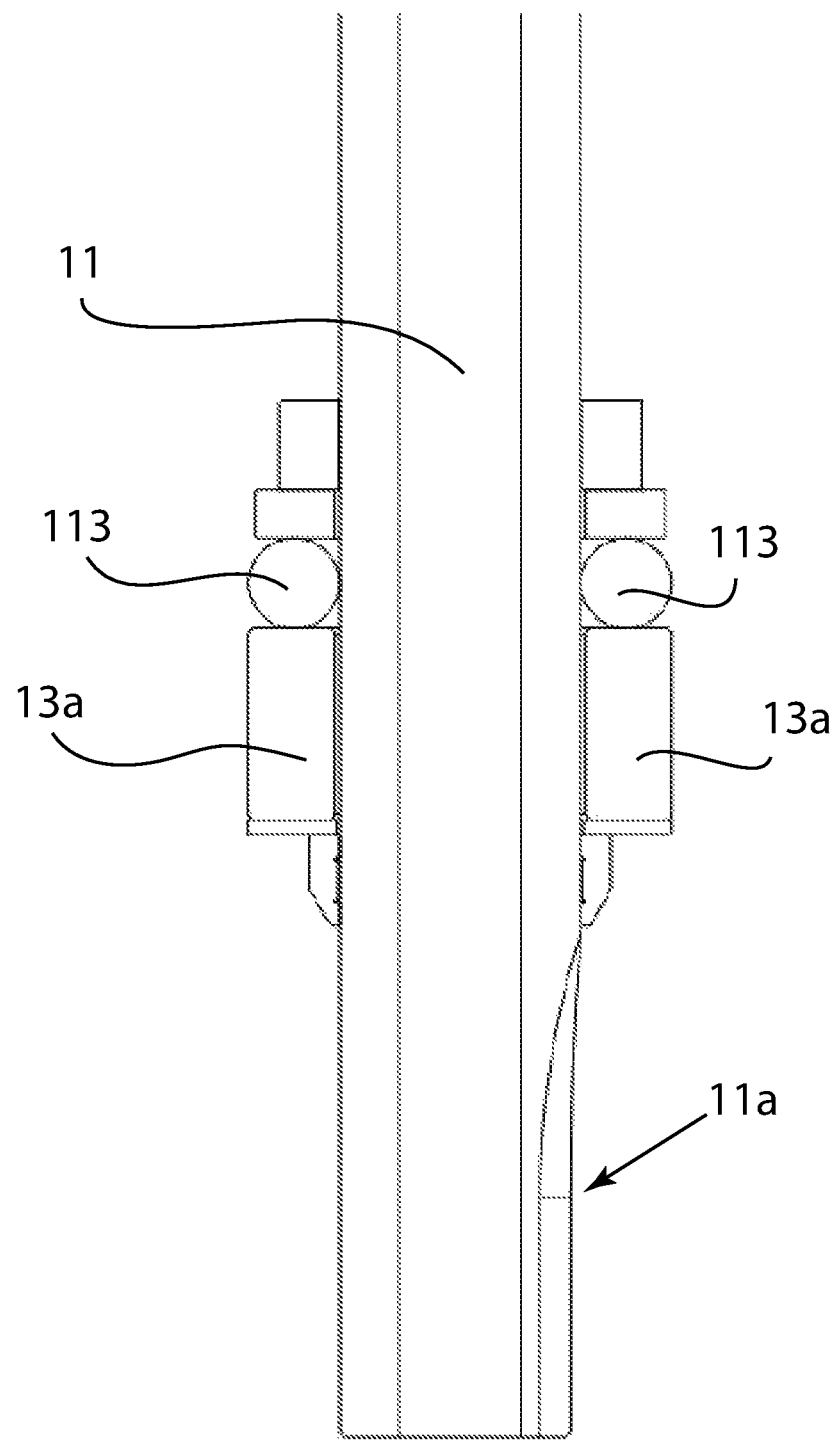
FIG. 5 depicts a side cross-section view of a spindle, in accordance with one embodiment.

As shown in FIG. 5, in another embodiment a cushioning component 113 may be used instead of the cushioning magnet 13b. The cushioning component 113 may be an O-ring or other material capable of absorbing any impact between the spindle 11 and the nozzle 12a.

The use of the cushioning magnet 13b or the cushioning component 113 may uncouple the mass of the nozzle 12 from the mass of the spindle 11, in one embodiment. This may reduce any impact on electrical components during picking and placing.

In a further embodiment, the spindle 11 may have a spindle orientation component 11*a*, as shown in FIG. 5. The spindle orientation component 11*a* may prevent the spindle 11 from attaching to the nozzle 12 unless the spindle orientation component is in a specific position relative to the nozzle 12. The spindle orientation component 11*a* is shown as a groove or removed portion of the spindle 11 that is configured to align with a corresponding nozzle orientation component (not shown). In other embodiments, the spindle orientation component 11*a* may be a projection. The nozzle orientation component may be a projection, if the spindle orientation component 11*a* is a groove, or a groove, channel or the like if the spindle orientation component 11*a* is a projection. The spindle orientation component 11*a* and corresponding nozzle orientation component may serve to facilitate precise alignment of the spindle 11 and nozzle 12 and precise control of movement in the rotational plane (θ).

Figure 7A:
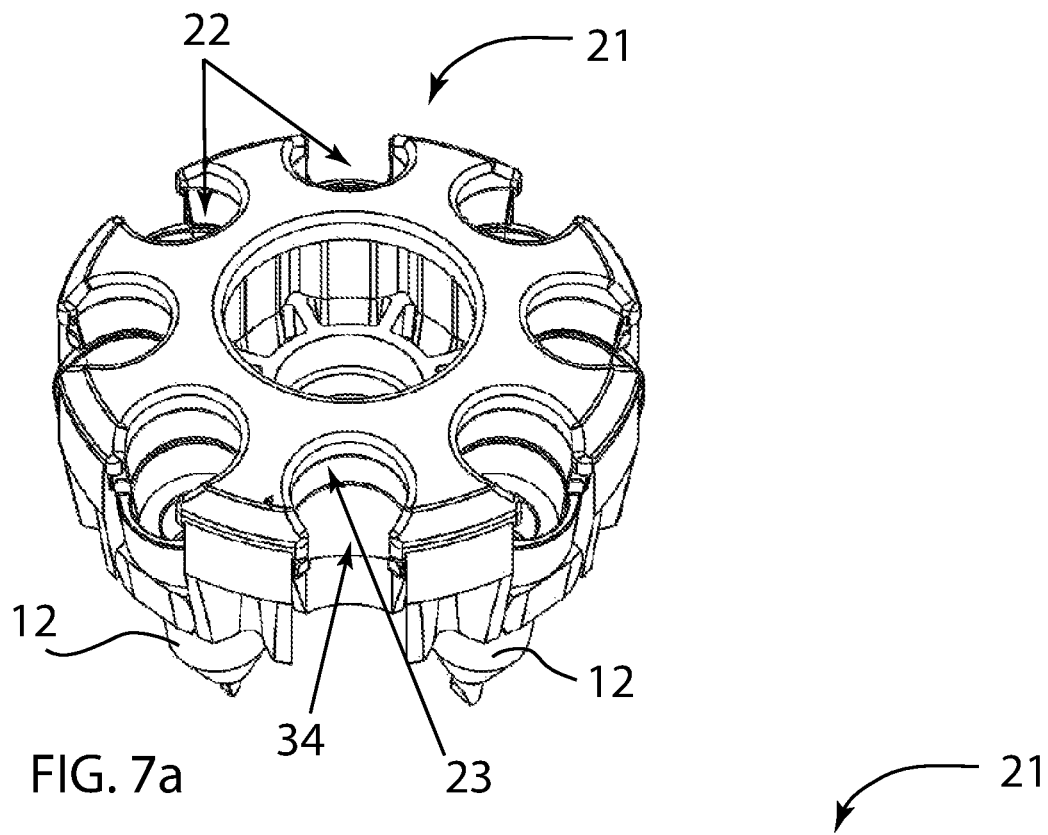
FIG. 7a depicts a perspective view of a revolver of the nozzle changer of FIGS. 6a and 6b, including nozzle magnets, in accordance with one embodiment.
Figure 7B:
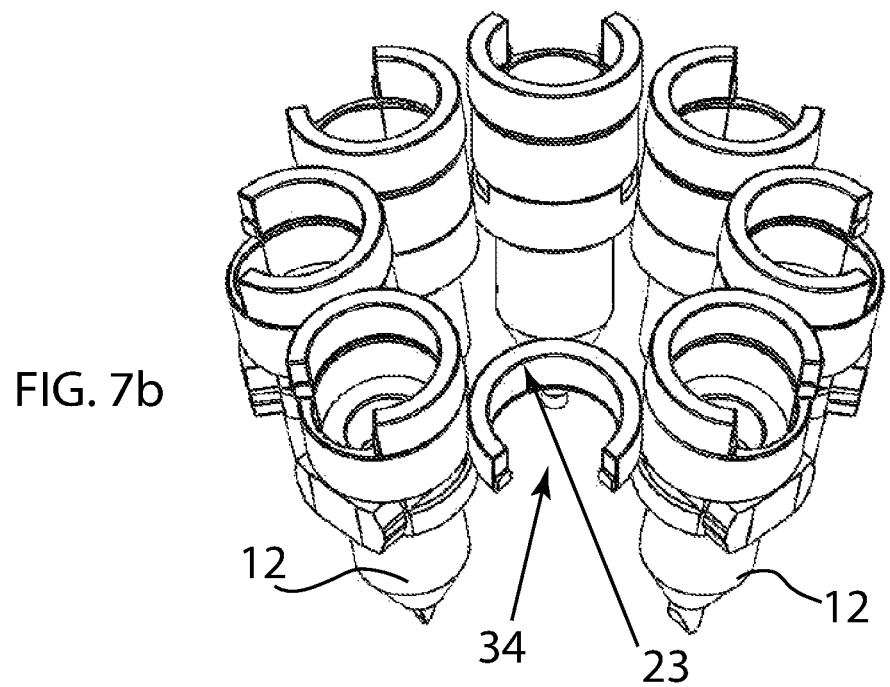
FIG. 7b depicts a perspective view of the revolver of FIG. 7a, with portions removed to more clearly show the nozzle magnets, in accordance with one embodiment.

Referring now to FIGS. 6*a*, 6*b*, 7*a*, and 7*b* embodiments of the nozzle changer 20 are shown in more detail, particularly the area including the revolver 21 and the plurality of nozzle holders 22. In one embodiment, one or more of the plurality of nozzle holders 22 may comprise an opening 34 on the perimeter of the revolver 21. In the embodiments shown, each of the plurality of nozzle holders 22 includes one of the openings 34. Each opening 34 may be shaped to allow passage of a portion of the spindle 11 to enter the opening 34, as shown in FIG. 6 according to one embodiment. One or more of the plurality of nozzle holders 22 may comprise a retaining mechanism designed to hold one or more of the plurality of nozzles 12. As shown most clearly in FIG. 7*b*, in one embodiment, the retaining mechanism may comprise one or more nozzle holder magnets 23 configured to interact with the nozzle attachment component 14 of the nozzle 12. Referring specifically to FIG. 7*b*, an embodiment of the nozzle changer 20 is shown, particularly the area including the revolver 21 and the plurality of nozzle holders 22, wherein only the nozzle holder magnets 23 are shown, together with the plurality of nozzles 12 and the openings 34. As shown in the Figures, the one or more nozzle holder magnets 23 may frame a portion of the openings 34 of one or more of the plurality of nozzle holders 22. In a further embodiment, other methods of retaining the plurality of nozzles 12 in the nozzle holders 22 may be used, such as a snap detent mechanism, other mechanical means of retention, or other means known in the art.

Figure 8:
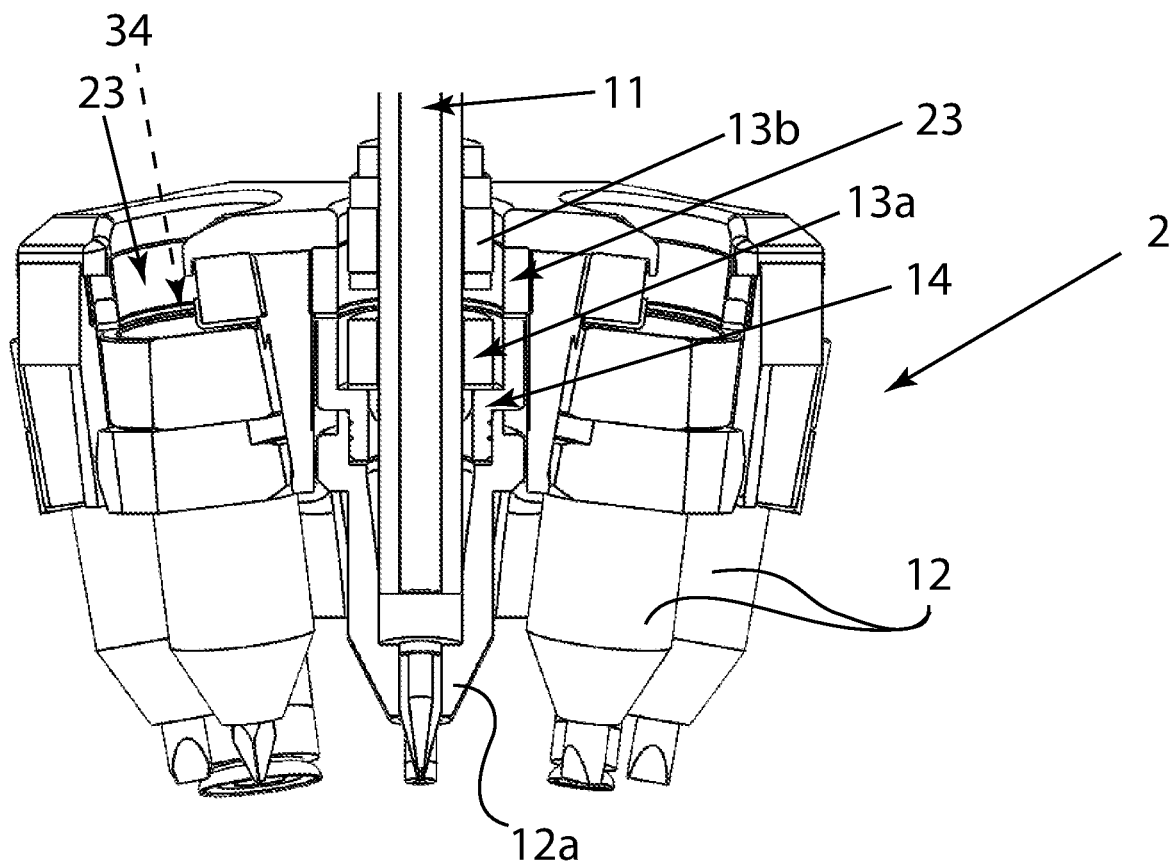
FIG. 8 depicts a front cross-section view of a portion of the system, including the spindle, nozzle, and revolver, in accordance with one embodiment.

Referring now to FIG. 8, cross-section views of a portion of the system 100 including the spindle 11, nozzle 12*a*, and revolver 21 are shown wherein the plurality of nozzles 12 are also attached to the revolver 21 in the plurality of nozzle holders 22 in accordance with one embodiment. In the embodiment shown, the nozzle attachment component 14 may be in the form of an iron or steel washer or ring, which is disposed in an annular form substantially about the circumference of a top portion of the nozzle 12*a*. The nozzle attachment component 14 may be capable of magnetically interacting with either or both of the spindle magnet 13*a* and the nozzle holder magnets 23, as the spindle 11 moves through the opening 34.

Figure 9:
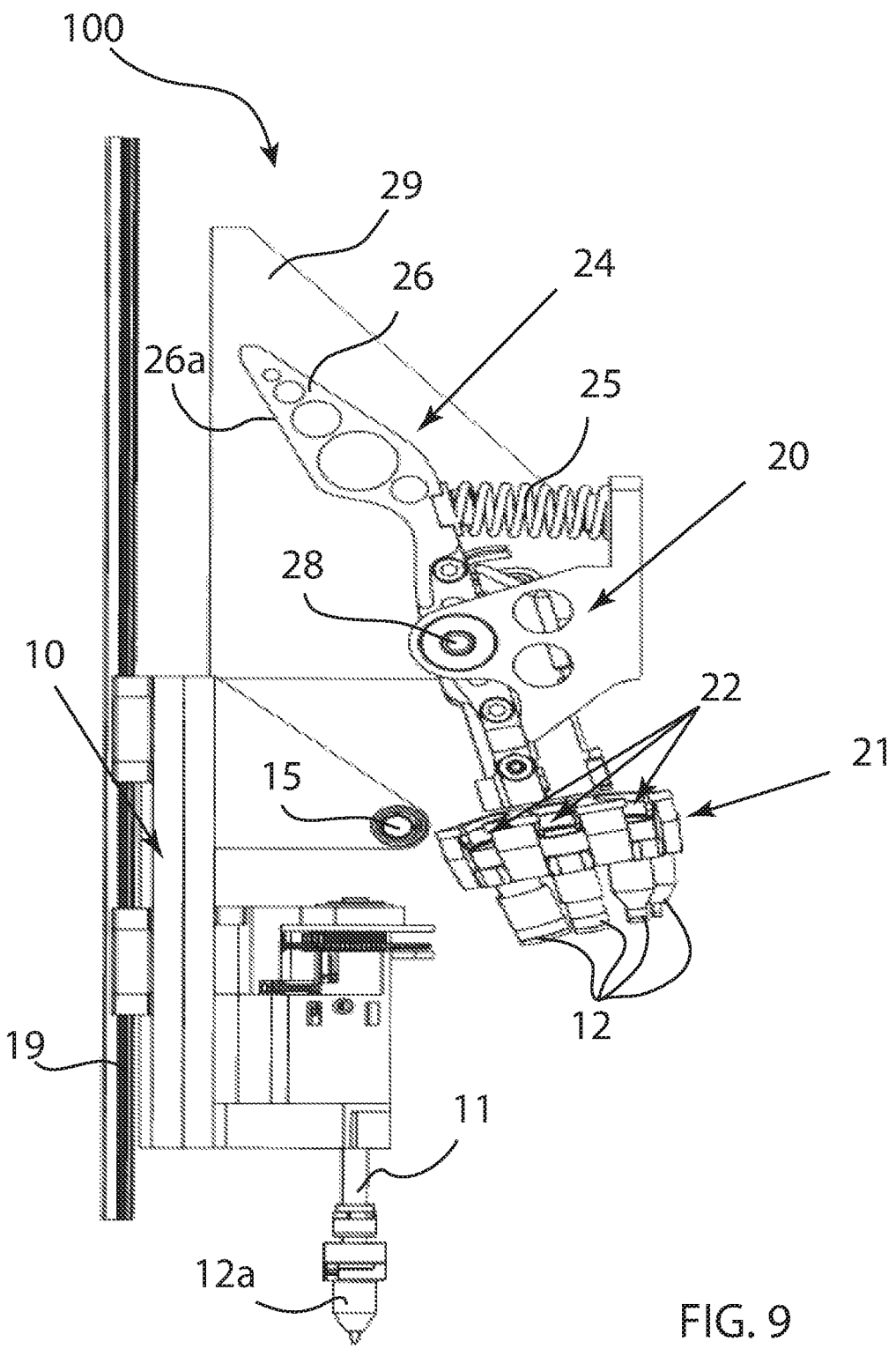
FIG. 9 depicts a side perspective view of the system of FIG. 1, in which in the spindle assembly is in the non-retracted position with a first nozzle attached to the spindle, in accordance with one embodiment.

Referring now to FIG. 9, a side view of the system 100 is shown. In this depiction, the spindle assembly 10 is shown in the non-retracted position. With reference to FIGS. 1 and 9, in one embodiment the spindle assembly 10 may include a cam roller 15. The cam roller 15 may be located substantially above the spindle 11, as shown. The cam roller 15 may be configured to interact with the cam mechanism 24 of the nozzle changer 20. The cam mechanism 24 may include a cam spring device 25 and a cam arm 26. The cam spring device 25 may be any component with a spring constant, in one embodiment. In one embodiment, the cam roller 15 may be designed to interact directly with the cam arm 26.

As can be seen in FIG. 9, the spindle assembly 10 may freely move up and down for picking and placing of components without interaction with the cam roller 15 and the cam arm 26. In one embodiment, the distance between the cam roller 15 and the cam arm 26 may determine the stroke (in the Z axis) for picking and placing without a nozzle change.

Figure 10:
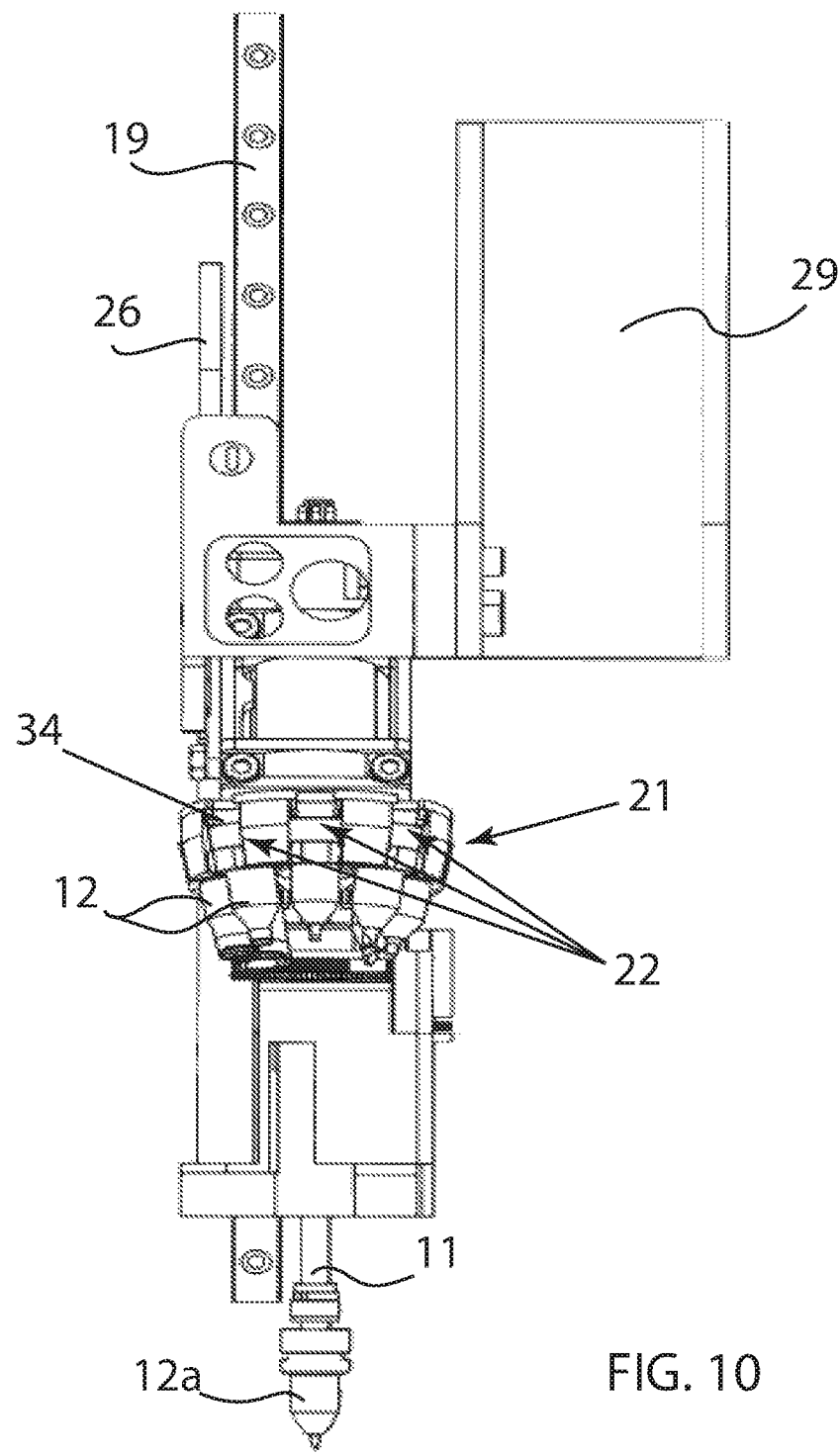
FIG. 10 depicts a front perspective view of the system of FIGS. 1 and 9, in which the spindle assembly is in the non-retracted position with a first nozzle attached to the spindle, in accordance with one embodiment.

FIG. 10 shows a front view of the system 100. Like FIGS. 1 and 9, FIG. 10 depicts the spindle assembly 10 in the non-retracted position, such as a position in which the spindle assembly 10, spindle 11, and one of the plurality of nozzles 12 are being used to pick and place electronic components. As can be seen, in this embodiment, the nozzle changer 20 may be located substantially above the spindle 11, when the spindle assembly 10 is in the non-retracted position. Further, as is shown by FIGS. 9 and 10, in one embodiment, the revolver 21 may be held above and to a side of the spindle 11 when the spindle assembly 10 is in the non-retracted position.

Referring again to FIGS. 1 and 9, in one embodiment, the nozzle changer 20 may be capable of pivoting around the central axis 28. However, the cam spring device 25 may bias the nozzle changer 20 in a position away from the spindle assembly 10 when the spindle assembly 10 is in the non-retracted position, and may prevent the nozzle changer 20 from pivoting around the central axis 28. For example, the nozzle changer 20 may be biased by the cam spring device 25 so that the revolver 21 is held away from the spindle 11, when the spindle assembly 10 is in the non-retracted position. This may prevent the nozzle changer 20 from interfering with the pick and place operation of spindle assembly 10 during use in the non-retracted position.

In an embodiment, the spindle assembly 10 and the nozzle changer 20 may be positioned such that the cam roller 15 may impact the cam arm 26 when the spindle assembly 10 moves upwards (in the Z-axis) into a retracted position. The impact of the cam roller 15 on the cam arm 26 may displace, and cause compression of, the cam spring device 25. The cam arm 26 may be of a curved shape or design to facilitate contact with the cam roller 15 and compression of the cam spring device 25 during upward movement into the retracted position. Compression of the cam spring device 25 may result in displacement of the revolver 21 and pivoting of the nozzle changer 20 about the central axis 28. In one embodiment, the direction of displacement of the revolver 21 may be toward the spindle 11 of the spindle assembly 10 as the spindle assembly moves upward (in the Z-axis) into the retracted position.

Figure 11:
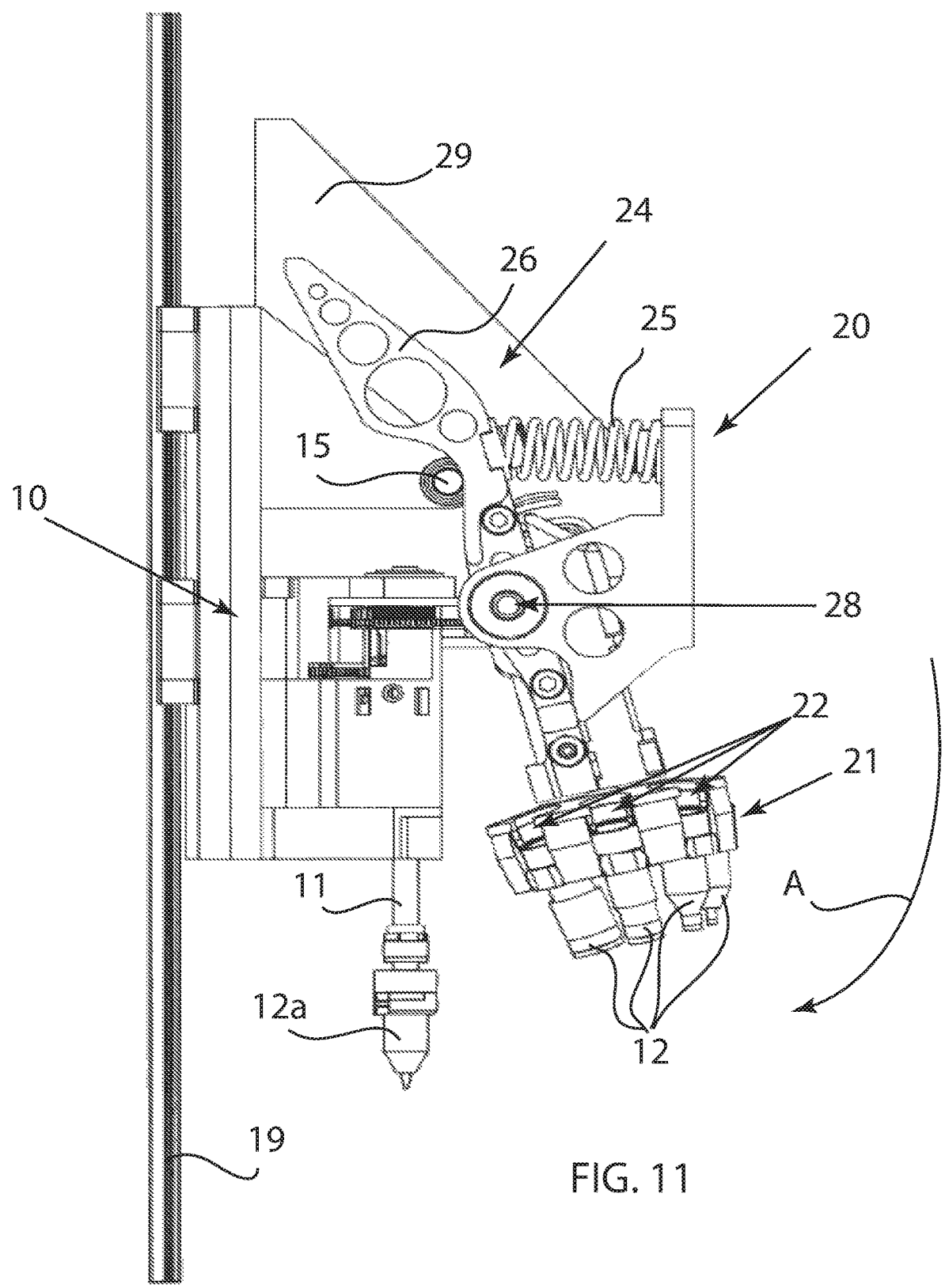
FIG. 11 depicts a side perspective view of the system of FIGS. 1 and 9-10 in a second position, in accordance with one embodiment.
Figure 12:
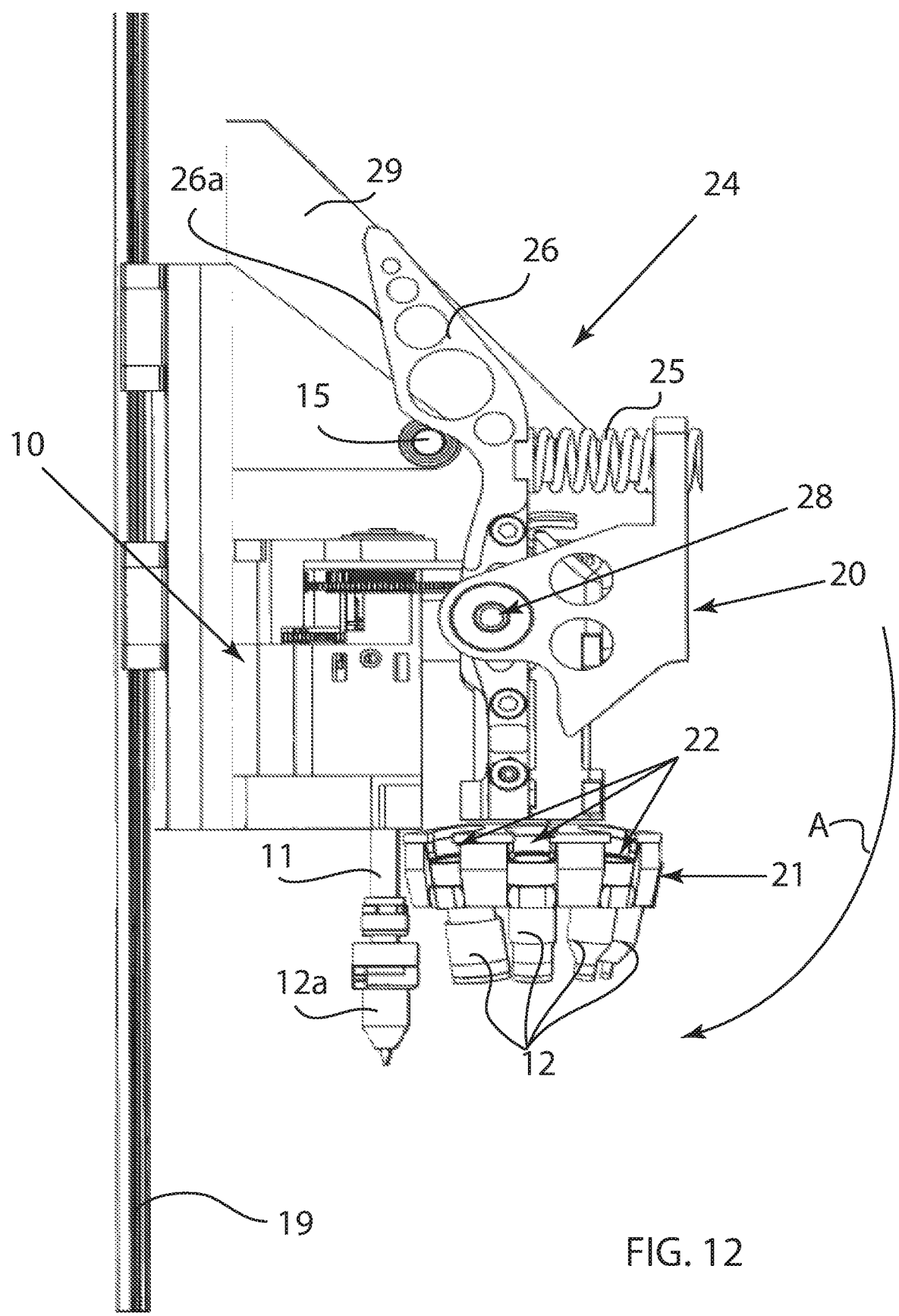
FIG. 12 depicts a side perspective view of the system of FIGS. 1 and 9-11 in a third position, in accordance with one embodiment.

FIGS. 11-15 show the movement of the spindle assembly 10 upward (in the Z-axis) toward the retracted position. As is shown, the interaction between the cam roller 15 and the cam mechanism 24 as the spindle assembly 10 is moved upward into the retracted position may compress the cam spring device 25 in one embodiment. As can be seen in FIGS. 11-12, as the spindle assembly 10 is raised upwards into the retracted position, the cam roller 15 contacts the cam arm 26 and causes displacement of the cam arm 26. The displacement by the cam roller 15 contacting the cam arm 26 may cause the cam spring device 25 to be compressed. The contact by the cam roller 15 on the cam arm 26 may also cause pivoting of the nozzle changer 20 around the central axis 28, thus moving the revolver 21 toward the spindle 11, as shown by arrow A in FIGS. 11 and 12.

Figure 13:
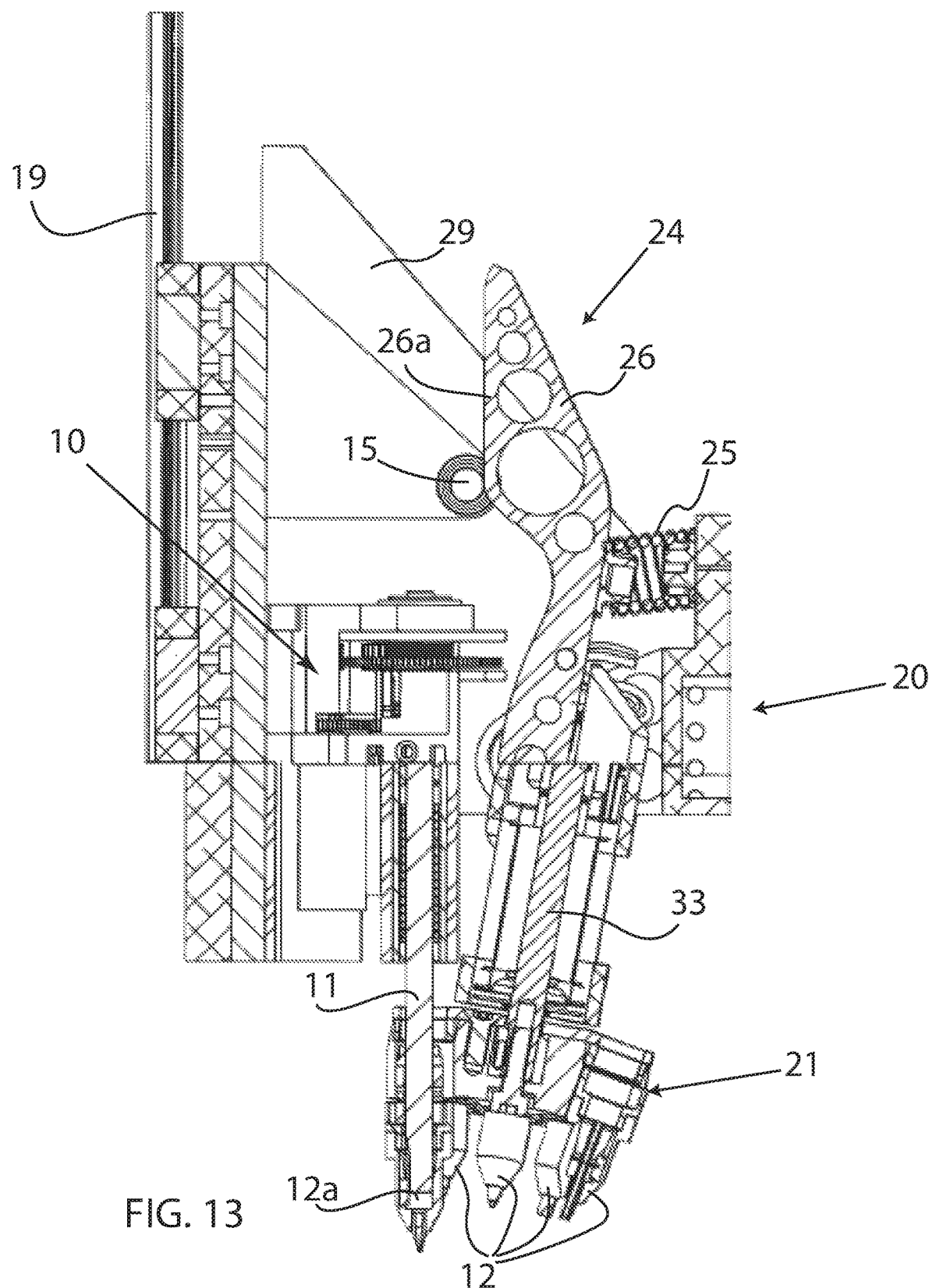
FIG. 13 depicts a side cutaway view of the system of FIGS. 1 and 9-12 in a fourth position, in accordance with one embodiment.

Referring now to FIG. 13, as the spindle assembly 10 moves further upward (along the Z axis) toward the retracted position, the displacement of the cam arm 26 caused by the cam roller 15 may reach the maximum compression of the cam spring device 25 and cause no further pivoting of the nozzle changer 20 about the central axis 28. The cam roller 15 may now continue traveling on a straight section 26a of the cam arm 26, allowing further travel of the spindle assembly 10 to exchange the nozzle 12 by movement of the spindle 11 upward through the opening 34 of the nozzle holder 22. The compression of the cam spring device 25 and rotation of the nozzle changer 20 may bring the revolver 21 closer to the spindle 11. In one embodiment, the revolver 21 via opening 34 may embrace the spindle 11. This embracement of the spindle 11 by opening 34 of the revolver 21 may occur at one of the plurality of nozzle holders 22 in one embodiment. In one embodiment, the spindle 11 may be moved into the opening 34 of one of the plurality of nozzle holders 22, without any direct contact between the spindle 11 and the nozzle holder 22 or the revolver 21.

Figure 14:
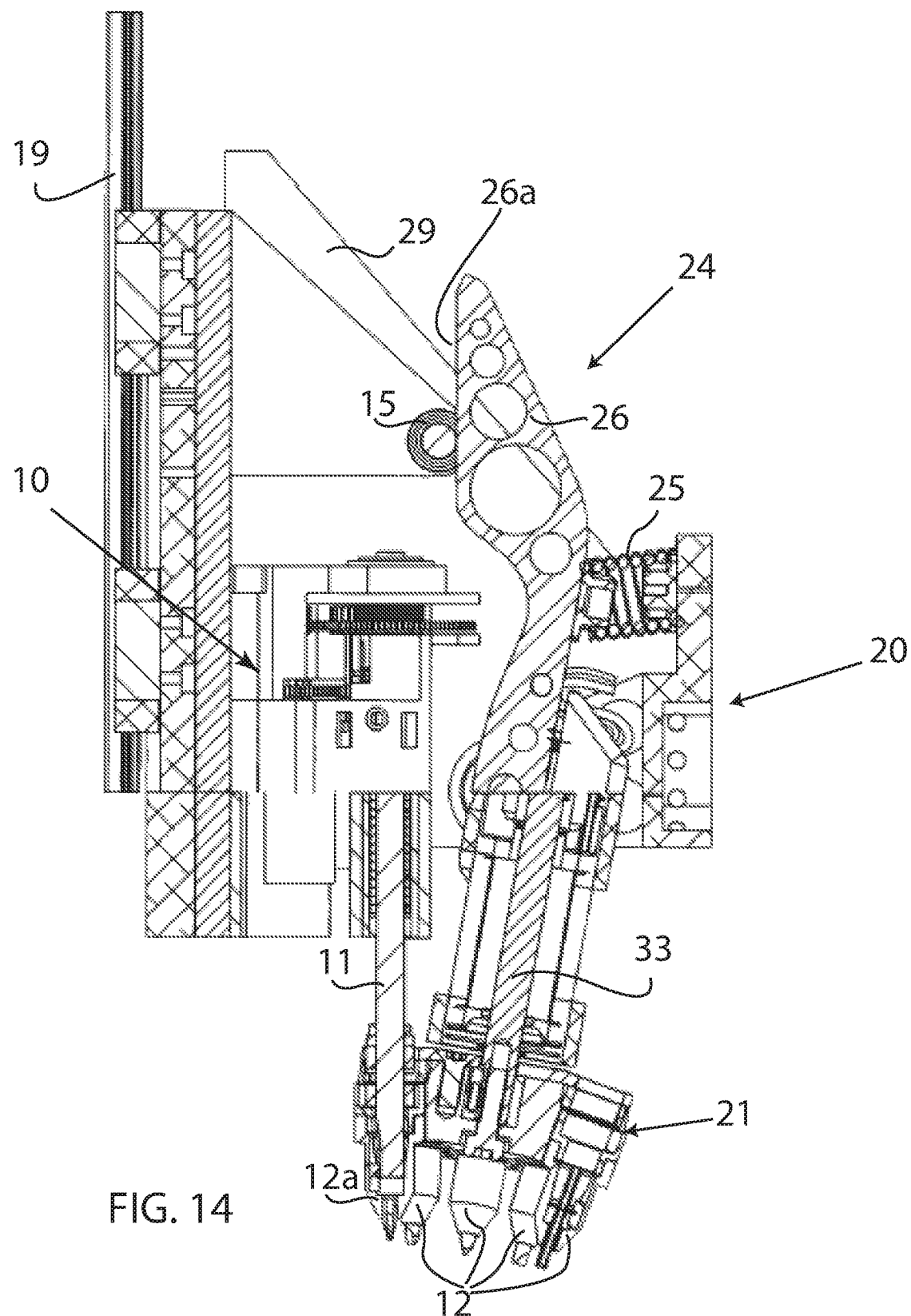
FIG. 14 depicts a side cutaway view of the system of FIGS. 1 and 9-13 in a fifth position, in accordance with one embodiment.

In FIG. 14, after the displacement of the cam arm 26 caused by the cam roller 15 has reached the maximum compression of the cam spring device 25 and the revolver 21 has been moved toward the spindle 11 far enough that the spindle 11 passes through one of the plurality of nozzle holders 22 (i.e., far enough that the spindle 11 is moved into the opening 34 of one of the plurality of nozzle holders 22), the cam roller 15 may move along the straight section 26a of the cam arm 26. As the cam roller 15 continues to move upward along the straight section 26a of the cam arm 26, there may be no substantial change in the displacement of the cam arm 26. The nozzle changer 20 and the revolver 21 may instead be held in a substantially constant location in relation to the spindle 11. While the location of the nozzle changer 20 and the revolver 21 remains substantially constant, the spindle assembly 10 and the spindle 11 may continue to move upward (along the Z axis) toward the fully retracted position. In some embodiments, the cam spring device 25 may be a helical or coil spring, as shown in the Figures. However, the cam spring device 25 may be any other type of spring device having a spring constant and configured to move the nozzle changer 20 in some or all of the ways described herein. In another embodiment the cam, cam roller, and spring functionality may be realized by a servo motor drive that is electronically and by software control coupled to the z-motion of the spindle assembly.

As the spindle assembly 10 and spindle 11 approach the retracted position, the first nozzle 12a attached to the spindle 11 may contact one of the plurality of nozzle holders 22, now referred to as the first nozzle holder 22a. In one embodiment, the first nozzle holder 22a may be designed to retain the first nozzle 12a as the spindle 11 and spindle assembly 10 continue to move upward into the retracted position, either by magnetic interaction, a snap detent mechanism, or other mechanism, thus removing the first nozzle 12a from the spindle 11.

Figure 15:
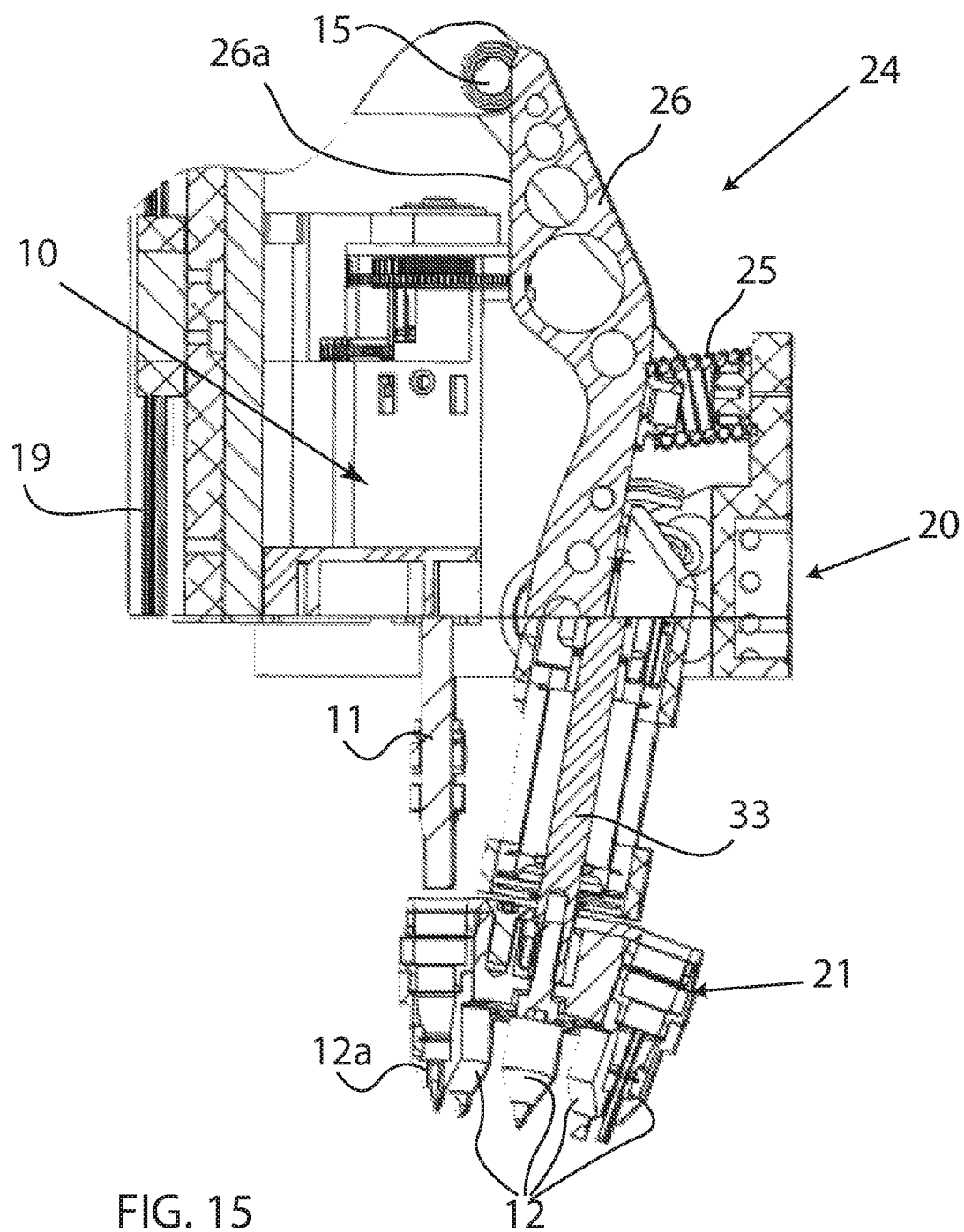
FIG. 15 depicts a side cutaway view of the system of FIGS. 1 and 9-14, in which the spindle assembly is in a fully retracted position with the first nozzle no longer connected to the spindle but attached to the nozzle changer, in accordance with one embodiment.
Figure 16:
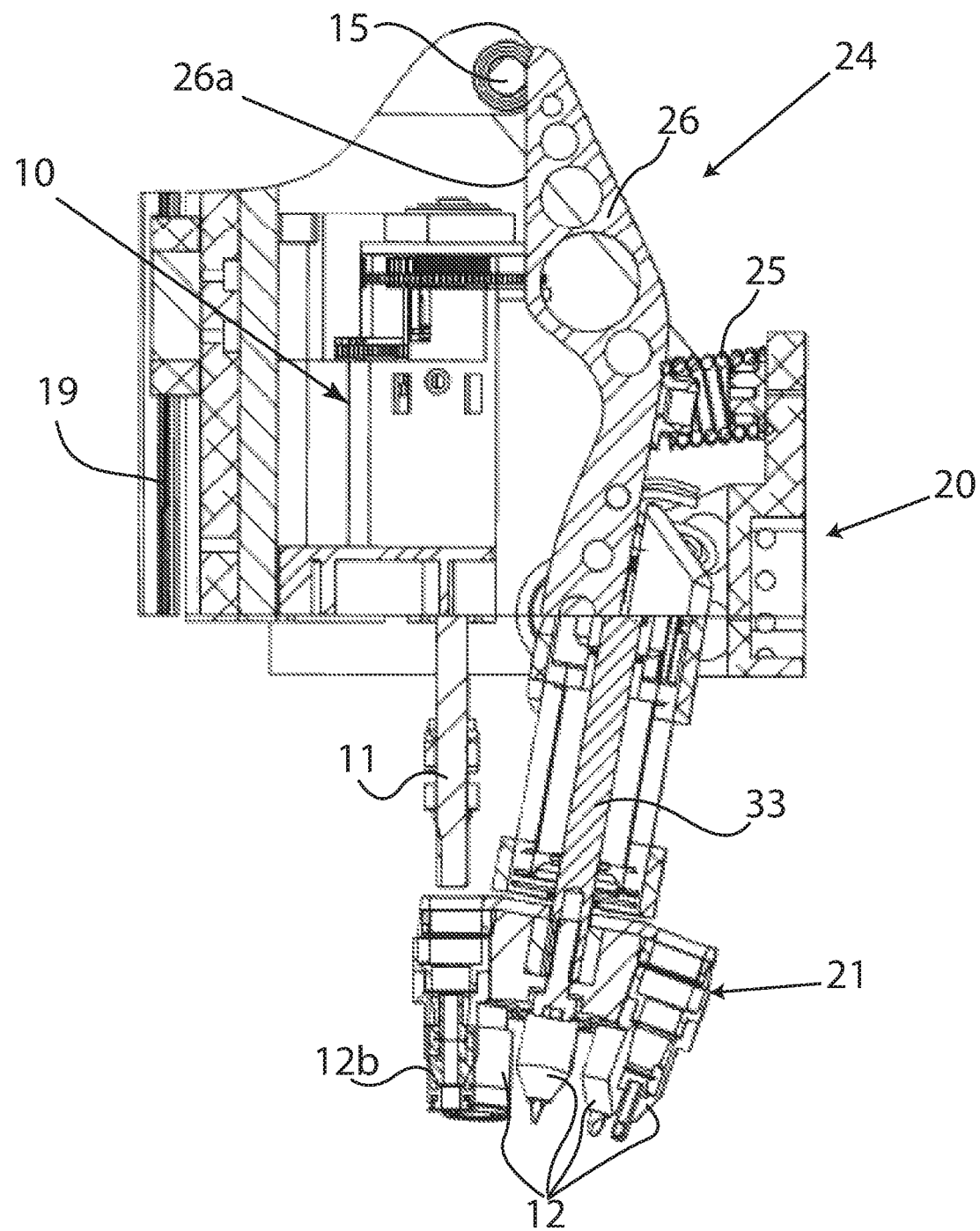
FIG. 16 depicts a side cutaway view of the system of FIGS. 1, and 9-15, in which the spindle assembly is in a fully retracted position, with the first nozzle no longer connected to the spindle but attached to the nozzle changer, and the nozzle changing device rotated to align a second nozzle below the spindle.

FIGS. 15 and 16 depict the spindle assembly 10 having moved completely upward (in the Z-axis) and fully into the retracted position according to one embodiment. As shown in FIG. 15, the first nozzle 12a may be retained by the first nozzle holder 22a, and thus may become detached from the spindle 11. Following detachment of the first nozzle 12a, the revolver 21 may rotate. Rotation of the revolver 21 may be accomplished by a variety of means. For example, in one embodiment, rotation of the revolver 21 may be accomplished by the servo motor 33. Other means of rotation may also be used. Following rotation of the revolver 21, a second nozzle holder 22b may be aligned substantially beneath the spindle 11. The second nozzle holder 22b may retain a second nozzle 12b as shown in FIG. 16, in one embodiment.

Following rotation of the revolver 21, the spindle assembly 10 and the spindle 11 may move back downward (along the Z-axis) and back toward the non-retracted position. As the cam roller 15 moves back down the straight section 26a of the cam arm 26, the spindle 11 may move downwards, while the nozzle changer 20 and the revolver 21 may be held in a substantially constant location in relation to the spindle 11. The spindle 11 may thus pass through the second nozzle holder 22b and engage the second nozzle 12b. The force of the spindle 11 may be sufficient to overcome any retaining force retaining the second nozzle 12b in the second nozzle holder 22b. The second nozzle 12b may then be attached to the spindle 11, and may be used by the spindle assembly 10 in the assembly of electronics components.

Figure 17:
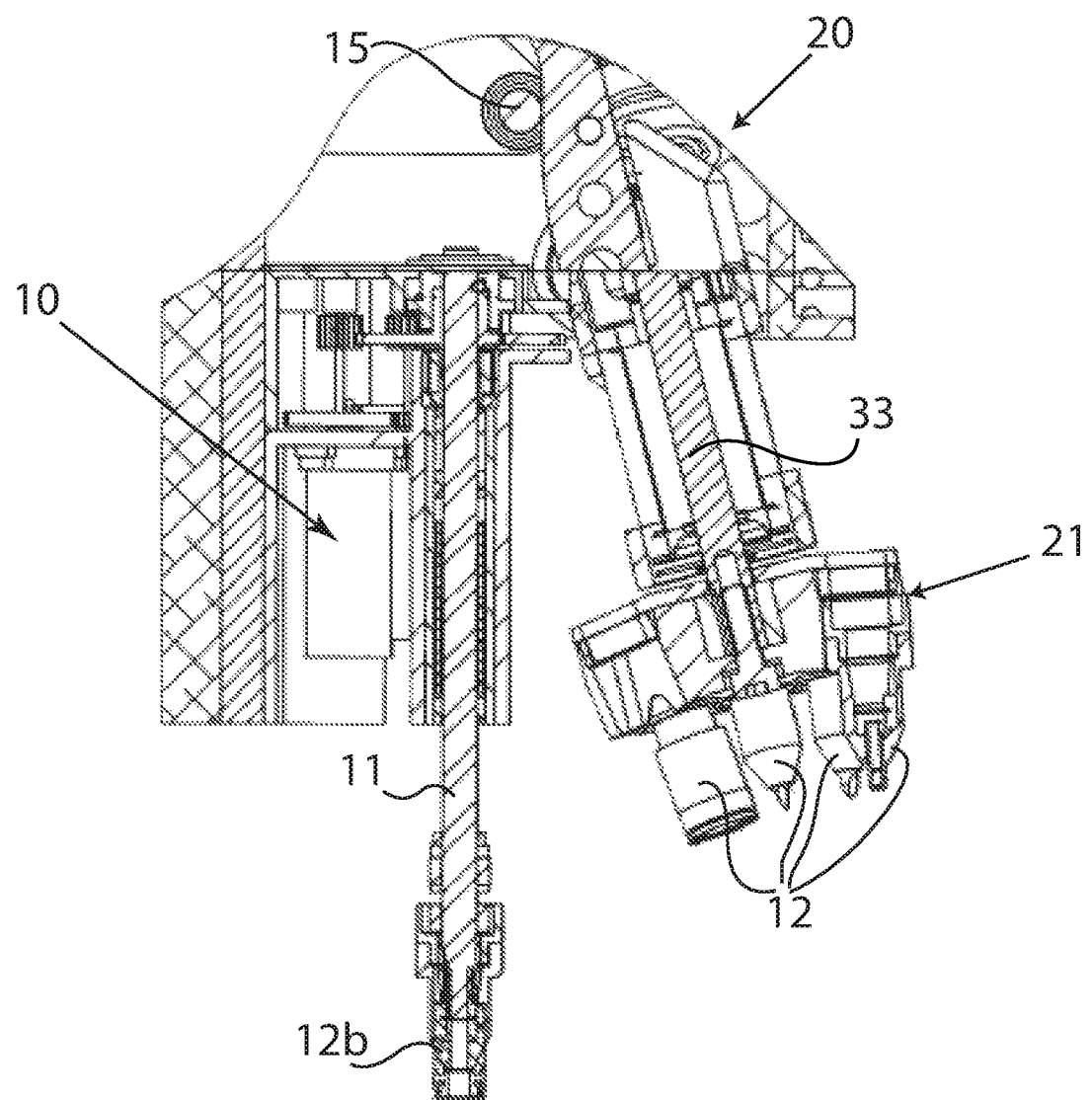
FIG. 17 depicts a side cutaway view of the system of FIGS. 1 and 9-16, in which the spindle assembly is the non-retracted position, with a second nozzle attached to the spindle, in accordance with one embodiment.

As shown in FIG. 17, as the spindle assembly 10 and the spindle 11 continue moving downwards into the non-retracted position, the cam spring device 25 may force the revolver 21 of the nozzle changer 20 away from the spindle assembly 10 and the spindle 11, thus biasing the nozzle changer 20 so that it is held out of the way of the spindle assembly 10, spindle 11, and second nozzle 12b when the spindle assembly 10 is in the non-retracted position, such as during use in the picking and placement of electronics components.

With reference again to the spindle magnet 13a, the nozzle attachment component 14, and the one or more nozzle holder magnet 23, in one embodiment the force of attraction between the one or more nozzle holder magnet 23 and the nozzle attachment component 14 may be greater than the force of attraction between the spindle magnet 13a and the nozzle attachment component 14. This may create an "easy in, hard out" relationship in which the force required to remove the one of the plurality of nozzles 12 from the spindle 11 is greater and/or significantly or noticeably greater than the force to insert one of the plurality of nozzles 12 into one of the plurality of nozzle holders 22. This may prevent a situation in which one of the plurality of nozzles 12 becomes simultaneously unretained by both one of the plurality of nozzle holders 22 and the spindle 11, in which case the nozzle 12 would be dropped. Similarly, the "easy in, hard out" relationship may make it so that the force required to remove one of the plurality of nozzles 12 from one of the plurality of nozzle holders 22 is significantly greater than the force required to insert the spindle 11 into one of the plurality of nozzles 12 as well as the force required to retain one of the plurality of nozzles 12 on the spindle 11. This may prevent a situation in which one of the plurality of nozzles 12 becomes unretained by the spindle 11 before it is seated and retained by nozzle holder 22 and is dropped. The "easy in, hard out" relationship may also be used in embodiments in which retention of the nozzle 12 is accomplished by a snap detent mechanism or other mechanism.

In an embodiment, a single nozzle holder 22 of the revolver 21 may be empty (i.e., not retaining a nozzle 12) when the nozzle 12a is attached to the spindle 11, allowing for the nozzle 12a to be removed by being retained by the single nozzle holder 22 that is empty. The revolver 21 may then rotate to present any of the plurality of nozzles 12 for attachment to the spindle 11.

In a further embodiment, two nozzle holders 22 of the revolver 21 may be empty (i.e., not retaining a nozzle 12) when the nozzle 12a is attached to the spindle 11. Such an embodiment may enable selection from of a nozzle 12 from a location other than the revolver 21. For example, in one embodiment, two nozzle holders 22 of the revolver may be empty when the nozzle 12a is attached to the spindle 11. The nozzle 12a may be removed from the spindle 11 and retained by one of the empty nozzle holders 22 as has been described. Then the revolver 21 rotates such that the second empty nozzle holder is aligned with spindle 11. Spindle 11 may now move from the retracted position to the non-retracted position without another nozzle 12 attached to the spindle. The placement head 200 may then move the empty spindle 11 to another location, such as above a nozzle bank (not shown) from which an additional nozzle 12 may be selected and retained by the spindle 11. The additional nozzle 12 may later be removed from the spindle 11 and retained by an empty nozzle changer 22 of the revolver 21, or may be returned to the nozzle bank. Nozzles 12 may thus also be interchanged between the nozzle bank and the revolver 21 as desired.

Further disclosed herein and shown and exemplified in FIGS. 1-17 and in the description herein above is a method that includes providing a placement head, such as placement head 200, including a spindle assembly, such as the spindle assembly 10, wherein the spindle assembly includes a spindle, such as the spindle 11. The method may also include receiving by the spindle, a first nozzle, such as the first nozzle 12a, and attaching, by the spindle, the first nozzle. In one embodiment, the method may further include providing a nozzle changer including a revolver, such as the nozzle changer 20 with the revolver 21, and holding, by the revolver a plurality of nozzles, such as the plurality of nozzles 12. Further, the method may include moving, by the spindle assembly and changing the position of the nozzle changer in response to the movement of the spindle assembly. In one embodiment, the changing of the position of the nozzle changer in response to the movement of the spindle assembly may be accomplished by an interaction between the spindle assembly and a cam mechanism attached to the nozzle changer, such as the cam mechanism 24. For example, the spindle assembly 10 may include a cam roller, such as cam roller 15, which may contact the cam mechanism, resulting in displacement of the cam mechanism. Displacement of the cam mechanism may result in displacement or movement of the attached nozzle changer.

In one embodiment, the method may also include retaining, by the nozzle changer, the first nozzle so that the first nozzle is no longer attached to the spindle.

In a yet further embodiment, the method may include retaining, by the revolver, a second nozzle, such as the second nozzle 12b. Still further, the method may include rotating, by the revolver, to align the second nozzle beneath the spindle after the first nozzle is no longer attached to the spindle. Additionally, in one embodiment, the method may include moving, by the spindle assembly, a second time and retaining, by the spindle, the second nozzle as the spindle assembly moves the second time. The method may also include changing the position of the nozzle changer a second time in response to movement of the spindle assembly the second time.

In a yet further embodiment, the method may include providing a revolver, the revolver having two empty nozzle holders when the first nozzle is attached to the spindle. In a yet further embodiment, the method may include moving the spindle to another location, such as a nozzle bank, and retaining an additional nozzle, i.e., a nozzle that was not on the revolver, by the spindle. Still further, the method may include removing and retaining the additional nozzle from the spindle by an empty nozzle changer of the revolver, or returning the additional nozzle to the nozzle bank. Thus, the method may include interchanging nozzles between the revolver and the nozzle bank, by the spindle and nozzle changer.

In one embodiment, one or more of the steps of attaching and retaining may be accomplished by magnetic attraction, as has been described herein above. Other means of retaining may also be used, such as a snap-detent mechanism or other means.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A nozzle changer system comprising:
   a placement head, the placement head including a spindle assembly, the spindle assembly including a spindle capable of receiving one of a plurality of nozzles for attachment; and
   a nozzle changer, the nozzle changer including a revolver capable of holding a plurality of nozzles;
   wherein the nozzle changer is configured to move toward the spindle as the spindle assembly is moved into a retracted, raised position along a vertical axis such that a position of the nozzle changer is changeable in response to movement of the spindle assembly, and
   wherein the spindle includes a spindle magnet, at least one of the plurality of nozzles includes a magnetic nozzle attachment component, and the spindle magnet and the magnetic nozzle attachment component are configured to provide a magnetic attraction between the spindle magnet and magnetic nozzle attachment component.

2. The nozzle changer system of claim 1, further wherein the position of the nozzle changer is changeable using a cam mechanism.

3. The nozzle changer system of claim 1, further wherein the nozzle changer pivots about a fixed central axis when the spindle assembly moves in the vertical axis.

4. The nozzle changer system of claim 1, further wherein the position of the nozzle changer is changeable by force from a component of the spindle assembly.

5. The nozzle changer system of claim 1, wherein the revolver is capable of holding the plurality of nozzles is configured to rotate to align any one of the plurality of nozzles with the spindle.

6. The nozzle changer system of claim 2, wherein the cam mechanism biases the nozzle changer away from the spindle when the spindle assembly is in a non-retracted, lowered position along the vertical axis.

7. The nozzle changer system of claim 1, wherein the revolver is capable of holding the plurality of nozzles and includes a nozzle holder magnet configured to provide a magnetic attraction between the nozzle holder magnet and the magnetic nozzle attachment component.

8. The nozzle changer system of claim 1, further wherein the revolver has two empty nozzle holders when a nozzle of the plurality of nozzles is attached to the spindle.

9. A method comprising:
providing a placement head, the placement head including a spindle assembly, the spindle assembly including a spindle, wherein the spindle includes a spindle magnet;
receiving, by the spindle, a first nozzle;
attaching, by the spindle, the first nozzle;
providing a nozzle changer, the nozzle changer including a revolver;
holding, by the revolver, a plurality of nozzles, wherein at least one of the plurality of nozzles includes a magnetic nozzle attachment component;
moving, by the spindle assembly;
moving the nozzle changer toward the spindle as the spindle assembly is moved into a retracted, raised position along a vertical axis; and
providing a magnetic attraction between the spindle magnet and the magnetic nozzle attachment component.

10. The method of claim 9, further comprising:
retaining, by the nozzle changer, the first nozzle so that the first nozzle is no longer attached to the spindle; and
retaining, by the revolver, a second nozzle.

11. The method of claim 10, further comprising:
rotating, by the revolver, to align the second nozzle beneath the spindle after the first nozzle is no longer attached to the spindle.

12. The method of claim 11, further comprising:
moving, by the spindle assembly, a second time; and
retaining, by the spindle, the second nozzle as the spindle assembly moves the second time.

13. The method of claim 12, further comprising:
changing the position of the nozzle changer a second time in response to movement of the spindle assembly the second time.

14. The method of claim 12, wherein the step of attaching, by the spindle, the first nozzle is accomplished by magnetic attraction between the spindle magnet and the first nozzle.

15. The method of claim 10, wherein at least one of retaining by the nozzle changer the first nozzle and retaining, by the revolver, a second nozzle, is accomplished by magnetic attraction.

16. The method of claim 10, wherein at least one of retaining by the nozzle changer the first nozzle and retaining, by the revolver, a second nozzle, is accomplished by a detent mechanism.

17. The method of claim 9, further comprising:
providing the revolver with two empty nozzle holders when the first nozzle is attached to the spindle.

18. A system comprising:
a placement head, the placement head including a spindle assembly and a nozzle changer;
wherein the spindle assembly includes a spindle capable of receiving one of a plurality of nozzles for attachment;
wherein the nozzle changer includes a revolver capable of holding a plurality of nozzles;
wherein the spindle assembly and nozzle changer move with the placement head;
wherein the nozzle changer and the spindle assembly are independently movable on the placement head such that the nozzle changer is configured to move toward the spindle as the spindle assembly is moved into a retracted, raised position along a vertical axis, and
wherein the spindle includes a spindle magnet, at least one of the plurality of nozzles includes a magnetic nozzle attachment component, and the spindle magnet and the magnetic nozzle attachment component are configured to provide a magnetic attraction between the spindle magnet and magnetic nozzle attachment component.

* * * * *